United States Patent
Kukula et al.

[11] Patent Number: 6,059,837
[45] Date of Patent: May 9, 2000

[54] METHOD AND SYSTEM FOR AUTOMATA-BASED APPROACH TO STATE REACHABILITY OF INTERACTING EXTENDED FINITE STATE MACHINES

[75] Inventors: James H. Kukula, Beaverton, Oreg.; Thomas R. Shiple, Cupertino, Calif.

[73] Assignee: Synopsys, Inc., Mountain View, Calif.

[21] Appl. No.: 09/000,853

[22] Filed: Dec. 30, 1997

[51] Int. Cl.[7] .................................................. G06F 9/44
[52] U.S. Cl. .................................. 703/27; 703/2; 703/20; 395/500.06; 714/25
[58] Field of Search ........................ 395/500.03, 500.04, 395/500.05, 500.06, 500.34, 702, 707, 708; 714/25, 37; 703/2, 20, 37

[56] References Cited

U.S. PATENT DOCUMENTS

| | | | |
|---|---|---|---|
| 5,163,016 | 11/1992 | Har'El et al. | 364/578 |
| 5,291,427 | 3/1994 | Loyer et al. | 364/578 |
| 5,394,347 | 2/1995 | Kita et al. | 364/578 |
| 5,513,122 | 4/1996 | Cheng et al. | 364/489 |
| 5,594,656 | 1/1997 | Tamisier | 364/488 |
| 5,615,137 | 3/1997 | Holzmann et al. | 364/578 |
| 5,918,037 | 6/1999 | Tremblay et al. | 395/500.03 |

OTHER PUBLICATIONS

Ashar et al., "Boolean satisfiability and equivalence checking using general binary decision diagrams", IEEE, 1991, pp. 259–264.

*Primary Examiner*—Kevin J. Teska
*Assistant Examiner*—Thai Phan
*Attorney, Agent, or Firm*—Wagner, Murabito & Hao LLP

[57] ABSTRACT

A method and system for an automata-based approach to state reachability of an interacting extended finite state machine. The present invention comprises a computer system having a processor, and a memory coupled to the processor via a bus, the memory containing computer readable instructions which when executed by the processor cause the processor to implement a process in accordance with the present invention. A digital system is modeled as an extended finite state machine. Automata operations are applied to the extended finite state machine to efficiently compute a set of reachable states from an initial state. The design of the system is verified by determining whether the set of reachable states includes an undesirable state.

13 Claims, 6 Drawing Sheets

METHOD AND SYSTEM FOR AUTOMATA-BASED APPROACH TO STATE REACHABILITY OF INTERACTING EXTENDED FINITE STATE MACHINES

FIELD OF THE INVENTION

The field of the present invention pertains to state reachability analysis of state machines. More particularly, the present invention relates to using automata and automata operations to analyze state machines.

BACKGROUND OF THE INVENTION

Computer systems, software applications, and the devices and processes built around them are continually growing in power and complexity. Society's reliance on such systems is likewise increasing, making it critical that the systems obey the properties their designers intended. Typically, the more powerful and complex the system, the greater its utility and usefulness. However, as these computer and software implemented systems and processes become more powerful, detecting and correcting flaws within the systems becomes increasingly difficult.

Achieving the desired level of reliability in a complex system thus depends upon being able to analyze the system's design and characteristics early in the design process. In so doing, the consequences of design choices and trade-offs can be explored and tested prior to design implementation, and potentially disastrous flaws can be detected and remedied while their cost of repair is still relatively inexpensive. For example, detecting a flaw in a microprocessor design prior to its mass fabrication is much more desirable and much more economical than correcting the consequences of the flaw after the microprocessor has been deployed in systems throughout the world. Computer engineers and other designers of complex systems use numerous tools to aid in system design and debugging. One of the most powerful of such tools is the "state machine".

A state machine, or state automaton, is an abstract machine consisting of a set of states, a set of input events, a set of output events, and a state transition function. The state transition function takes the current state and an input event and returns a new set of output events and the next state. A state machine is typically depicted as a state transition diagram which consists of circles representing specific states and lines between the states to represent transitions. One or more actions, for example one or more inputs or outputs, are usually associated with each transition.

A state machine may be classified as finite or extended. As its name implies, a finite state machine includes a finite number of states. Finite state machines are typically employed to model complex systems, which in turn, have a finite number of possible states. Each state of the complex system is represented as a state in the finite state machine. If the complex system can be realistically modeled using a state machine, the designer can examine the state machine to determine whether the complex system functions as desired. For example, the designer will examine the states of the state machine and the transitions between the states to determine whether the complex system can achieve all of its "desired states" and determine whether the system successfully avoids all "illegal states". A desired state may represent, for example, correctly calculating a desired result. An illegal state may represent, for example, and error condition which results in system malfunction. This design verification process is referred to as state reachability analysis. The goal of state reachability analysis is to compute the set of all reachable states from an initial state of a complex system, and to use this information to verify the behavior of the complex system.

Hence, a primary goal of state reachability analysis involves proving, in a mathematical sense, that error conditions in the design of a complex system cannot occur. This process is called formal verification. It typically involves using the high-level description language (HDL) design of the complex system to create a state machine model, and analyzing the state machine model to determine therefrom a set of possible states, and analyzing this set of possible states to determine a set of reachable states (e.g., from the initial state). The set of reachable states is then analyzed to determine whether it contains an illegal state (e.g., an error condition). It should be appreciated that this process involves detecting errors in the design of the complex system as opposed to the fabrication of the complex system. For example formal verification cannot detect errors in the fabrication process which result in bad transistors on semiconductor dies. Formal verification does detect errors in the HDL design of microprocessors and other such devices. It is often these design errors which are most difficult to prevent and most difficult to detect prior to widespread deployment of the complex system. For additional details regarding state machines and their theory of operation, please refer to J. H. Conway, "Regular Algebra and Finite Machines", 1971, Eds Chapman & Hall; S. C. Kleene, "Representation of Events in Nerve Nets and Finite Automata", 1956, Automata Studies. Princeton; and Hopcroft & Ullman, 1979, "Introduction to Automata Theory, Languages and Computations", Addison-Wesley.

There is a problem, however, when the size of the complex system becomes quite large. Large complex systems can result in a finite state machine having an unmanageably large number of possible states. For example a modern microprocessor often processes information in data words of up to 64 bits in one cycle. This results in a very large number of inputs and outputs per state, and a very large number of state transitions, and thus an extremely large number of possible states. The large number of inputs and outputs are typically referred to as large "data variables". Large data variables, as often used in a 64-bit microprocessor, leads to an extremely large number of possible states. The large number of possible states makes it hard to determine which of the possible states are actually reachable from the initial state of the microprocessor. This, in turn, makes it very difficult to determine whether the microprocessor can actually reach any illegal states.

Thus, what is desired is a more efficient method and system for state reachability analysis for complex systems having a very large number of possible states. What is desired is an efficient method and system for functional verification of the design of a complex system having a very large number of possible states. What is desired is a system which can efficiently process and analyze a state machine model having an extremely large (or even infinite) number of possible states. The present invention provides a novel solution to the above requirements.

SUMMARY OF THE INVENTION

The present invention provides a more efficient method and system for state reachability analysis for complex systems having a very large number of possible states. The process of the present invention provides an efficient method and system for functional verification of the design of a complex system having a very large number of possible states. In addition, the system of the present invention can efficiently process and analyze a state machine model having an extremely large (or even infinite) number of possible states.

In one embodiment, the process of the present invention is hosted on a computer system having a processor, and a memory coupled to the processor via a bus, the memory containing computer readable instructions which when executed by the processor cause the processor to implement a process in accordance with the present invention. A digital system is modeled as an extended finite state machine. Automata operations are applied to the extended finite state machine to efficiently compute a set of reachable states from an initial state. The design of the system is verified by determining whether the set of reachable states includes an undesirable state.

In addition, in accordance with the present invention, binary decision diagram (BDD) based implicit state enumeration of finite state machines (FSMs) is generalized to automata -based implicit state enumeration of infinite state extended finite state machines (EFSMs). An automaton representation of an unbounded width data-path in accordance with the present invention can be 10× more compact than the BDD representation of the corresponding 32-bit data-path.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

In the following detailed description of the present invention, a method and system for state reachability analysis for complex systems having a very large number of possible states, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer system. These descriptions and representations are the means used by those skilled in the data processing arts to most effectively convey the substance of their work to others skilled in the art. A procedure, logic block, process, step, etc., is here, and generally, conceived to be a self-consistent sequence of steps or instructions leading to a desired result. The steps are those requiring physical manipulations of physical quantities. Usually, though not necessarily, these quantities take the form of electrical, optical, or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "transferring" or "reading" or "processing" or "executing" or "storing" or "shadowing" or "buffering" or the like, refer to the action and processes of a computer system (e.g., computer system 712 shown in FIG. 6), or similar data processing device, that manipulates and transforms data represented as physical (electronic) quantities within the computer system's registers and memories into other data similarly represented as physical quantities within the computer system memories or registers or other such information storage, transmission or display devices.

The system of the present invention functions in part by generalizing the classic binary decision diagram technique of implicit state enumeration for finite state machines to an automaton based approach for implicit state enumeration of extended finite state machines which interact with data paths of fixed, parameterized, or unbounded width. As will be apparent from the discussions below, in one embodiment the system of the present invention yields an automaton representation of an unbounded width data path which is 10× more compact than a BDD representation of a corresponding data path (e.g., 32 bits) associated with the prior art.

Overview

The prior art BDD-based approach to functional verification of finite state machine systems is acceptable in some cases. This approach proceeds by first building BDDs for the next state functions and then using implicit state enumeration to explore a corresponding state transition graph. For systems with up to a few hundred flip-flops, this technique can be vastly more efficient than techniques that manipulate states explicitly. However, this approach usually fails for systems with wide numeric data-paths because the BDDs which correspond to the system become too large to efficiently analyze.

In one embodiment, the present invention analyzes systems whose data-paths consist of addition and comparison operations on integer data (e.g., a microprocessor, field programmable gate array, digital signal processor, or the like). The control component of such systems determines what operations to perform on the data, and in turn, the results of data comparisons influence the control component. The present invention functions in part by determining whether such systems are able to reach any undesirable states. The present invention accomplishes this by performing state reachability analysis. It should be noted that this analysis is performed on the system as a whole. This is due to the fact that a control component operating alone in an unconstrained environment can generally reach more states than when constrained by interaction with a data-path. Thus it is important to analyze the system as a whole, to avoid erroneously reporting states being reachable when in fact they are not.

In addition, as opposed to mere abstract systems, the present invention analyzes and verifies real digital systems, whose data-paths have fixed finite widths. To verify such systems, they are generalized to systems having data-paths with unbounded width. Conventionally, such a generalization (i.e., from finite width data-paths to unbounded width data-paths) would seem to make the verification problem more difficult. However, in accordance with the present invention, in some cases verifying the more general case is more efficient. The more general case may also better model the user's actual verification problem. For example, a designer might construct a parameterized library component that can be instantiated with arbitrary width. It is desirable to verify all possible instantiations.

Specifically, for example, in one embodiment, digital systems are modeled as extended finite state machines (EFSMs) which are finite state machines (FSMs) interacting with data-paths. In EFSMs, the state variables are partitioned into control variables (variables over finite domains) and data variables (unbounded integers). The behavior of an EFSM is defined by a set of transitions, each of which updates the values of both control and data variables. A transition has individual control states as origin and destination, but can specify the EFSM's behavior for whole sets of states. Each transition has a gating predicate over the data variables, which must be satisfied for the transition to "fire", and an update function that defines how the data variables change when the transition fires. The EFSM model of the present invention naturally captures a frequently used state machine structure, where a small, irregularly structured control component interacts with a large but regular data-path component. It should be noted that since data variables are unbounded integers, the state space of an EFSM of the present invention is infinite.

The modeling system of the present invention

Figure 1:
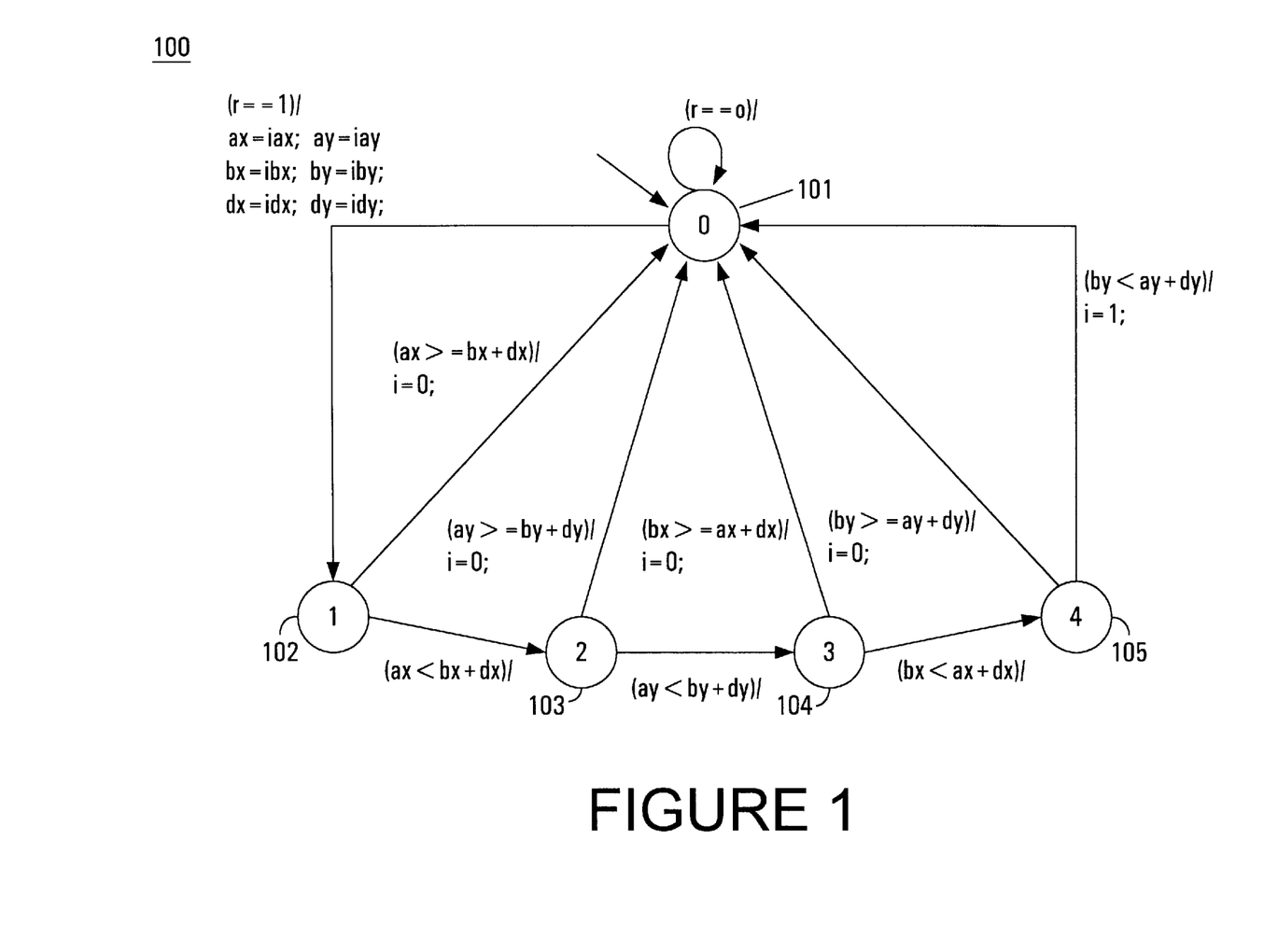
FIG. 1 shows a diagram of an extended finite state machine in accordance with one embodiment of the present invention.

With reference now to FIG. 1, a simple EFSM 100 with five control states 101–105 is shown. The control states 101 through 105 are represented graphically by circles. EFSM 100 also includes seven data variables ($a_x$, $a_y$, $b_x$, $b_y$, $d_x$, $d_y$, i), and ten transitions (represented graphically by arrows between circles). EFSM 100 functions by reading data from its environment and then checking a series of inequalities that determine whether the variable i should be assigned a "0" or "1" value.

It should be noted that while BDDs are commonly used to represent sets of states of finite state machines, the system of the present invention uses a different mechanism to handle the possibly infinite sets of states of EFSM 100. The theory of formal languages deals with infinite sets, in particular with infinite sets of strings. With this in mind, the present invention maps states of EFSM 100 to strings, and views sets of states as languages. Furthermore, since regular languages can be represented by finite state automata, the present invention represents EFSM 100 by automata since the sets of EFSM 100 states being considered form regular languages. Also, since a relation over states can be viewed as a set of pairs of states, the transition relation of EFSM 100 can also be viewed as a set of strings, and represented by an automaton.

It should be appreciated that, while EFSMs (e.g., EFSM 100) and language-recognizing automata are both state transition systems, they are used in very different ways. EFSMs are the machines, devices, etc., which need to be verified. For example, in the case of a signal processing chip that reads in raw data and writes out filtered data, in order to verify the design of the signal processing chip, the present invention generalizes its data-path to unbounded width. The present invention subsequently represents a single state of the chip by a string, and a set of states by a set of strings (i.e., by a language). To compactly represent this language, the present invention uses the automaton that recognizes it. This automaton reads in strings that represent states of the signal processing chip. If the automaton accepts a string, then the state is in the set which is being considered, otherwise not. Hence, it should be appreciated that EFSMs (e.g. EFSM 100) are the systems which are to be verified, and automata are merely the data structure used to represent sets of EFSM states and transitions.

As described above, the present invention uses implicit state enumeration to determine whether an EFSM (e.g., EFSM 100) can reach any undesirable states. For finite state systems, implicit state enumeration can be performed by means of various BDD operations such as intersection and existential quantification. In a parallel manner, the system of the present invention performs implicit state enumeration for EFSMs by means of similar operations on automata. In fact, this parallel is strong since BDDs can be thought of simply as the special case of acyclic automata.

It should be appreciated, however, that in moving from finite systems to infinite systems, state reachability for the infinite systems is undecidable. Accordingly, a reachability calculation may not converge in any finite number of steps. In accordance with the present invention however, solutions are obtainable in those cases where in fact fixed points are reached. And even in those cases when a fixed point cannot be reached, the "bugs", or errors, discovered will be true bugs, and any bug that exists can be discovered in a finite amount of time. The difficulty in this situation is that the absence of a bug cannot in all cases be determined within a finite amount of time.

Thus, the method and system of the present invention functions through the generalization of the BDD-based approach for verification of finite state systems, to an automata-based approach for verification of EFSMs (e.g., EFSM 100). Moving to EFSMs, in accordance with the present invention, has at least two potential advantages. First, it is often much more efficient to verify the EFSM as supposed to the FSM. For example, in many cases reductions in the size of the data structures required for analysis of 10x or greater over equivalent finite state machine BDDs for 32-bit data-paths has been achieved. Second, it is often much more efficient and much more desirable to verify all possible widths of data-paths as opposed to one specific design implementation.

As described above, conceptually, the variables of an EFSM are partitioned into control variables and data variables. However, the system of the present invention treats finite domain control variables as special cases of infinite domain data variables. This allows the present invention to treat variables uniformly, simplifying the formalism. Hence, in accordance with the present invention, an EFSM is formally defined to be a tuple ($k_i$, $k_o$, $k_s$, I, T,), where:

$k_i \epsilon N$ gives the number of input variables,
$k_o \epsilon N$ gives the number of output variables,
$k_s \epsilon N$ gives the number of state variables,
I: $N^{ks} \rightarrow B$ is the characteristic function of the set of valid initial states, and T: $N^{ki} \times N^{ks} \times N^{ks} \times N^{ko} \rightarrow B$ is the characteristic function of the transition relation for the state machine. $T(x_i, x_s, x'_s, x_o)$ is true if the EFSM, upon receiving input $x_i$, can make a transition from state $x_s$ to state $x'_s$ producing output $x_o$. N represents the set of natural numbers, and B the set (0,1). The transition relation T encodes both the transition gating predicates over the data variables and the update functions for the data variables. For example, consider the transition from control state 1 to 0 in EFSM 100 shown in FIG. 1, and let s be the control state variable. This transition is represented by the conjunction of the present control state value, the gating predicate, the next control state value, and the update function, as follows:

$$(s=1)\char`\^(a_x \geq b_x+d_x)\char`\^(s'=0) \char`\^(i'=0\char`\^a'_x=a_x\char`\^a'_y=a_y\char`\^b'_x=b_x\char`\^b'_y=b_y\char`\^d'_y=d_y)$$

Note that the "^" symbol is used to denote logical conjunction. The input is a "don't care" on this transition and the data variables $a_x$ $a_y$ $b_x$ $b_y$ $d_x$ $d_y$ keep their previous values. The entire transition relation T is just the disjunction of the formulas for each of the 10 transitions of this EFSM.

It should be appreciated that the present invention functions by addressing the problem of computing the set of reachable states of EFSMs over both the control and data variables. The present invention accomplishes this by performing implicit state enumeration. To describe how this is done, the relationship between EFSMs and Presburger arithmetic, and the relationship between Presburger arithmetic and automata is discussed below.

Representing EFSM States and Transitions

In order to compute the reachable states of an EFSM, an effective way to represent and manipulate sets of states and relations between states is needed. An overly rich set of arithmetic operators for the gating predicates and update functions would make calculations too difficult, while an overly constrained set would make the treatment of many practical EFSMs impossible. The present invention treats EFSMs whose gating predicates and update functions are definable in extended Presburger arithmetic.

Presburger arithmetic is the first-order theory of natural numbers with comparison and addition, and specifically without multiplication. Extended Presburger arithmetic is Presburger arithmetic extended with the V function, where V (n) in the largest power of 2 that divides n. For every extended Presburger formula there is a finite automaton that recognizes the integer tuples that satisfy the formula (the term "integer" is used loosely in the following discussions to refer to natural numbers). This link between finite automata and Presburger arithmetic is what makes automata useful for verification of EFSMs. In accordance with the present invention, by using automata to represent Presburger formulas, implicit state enumeration for EFSMs whose gating predicates and update functions are definable in extended Presburger, can be performed.

Figure 2:
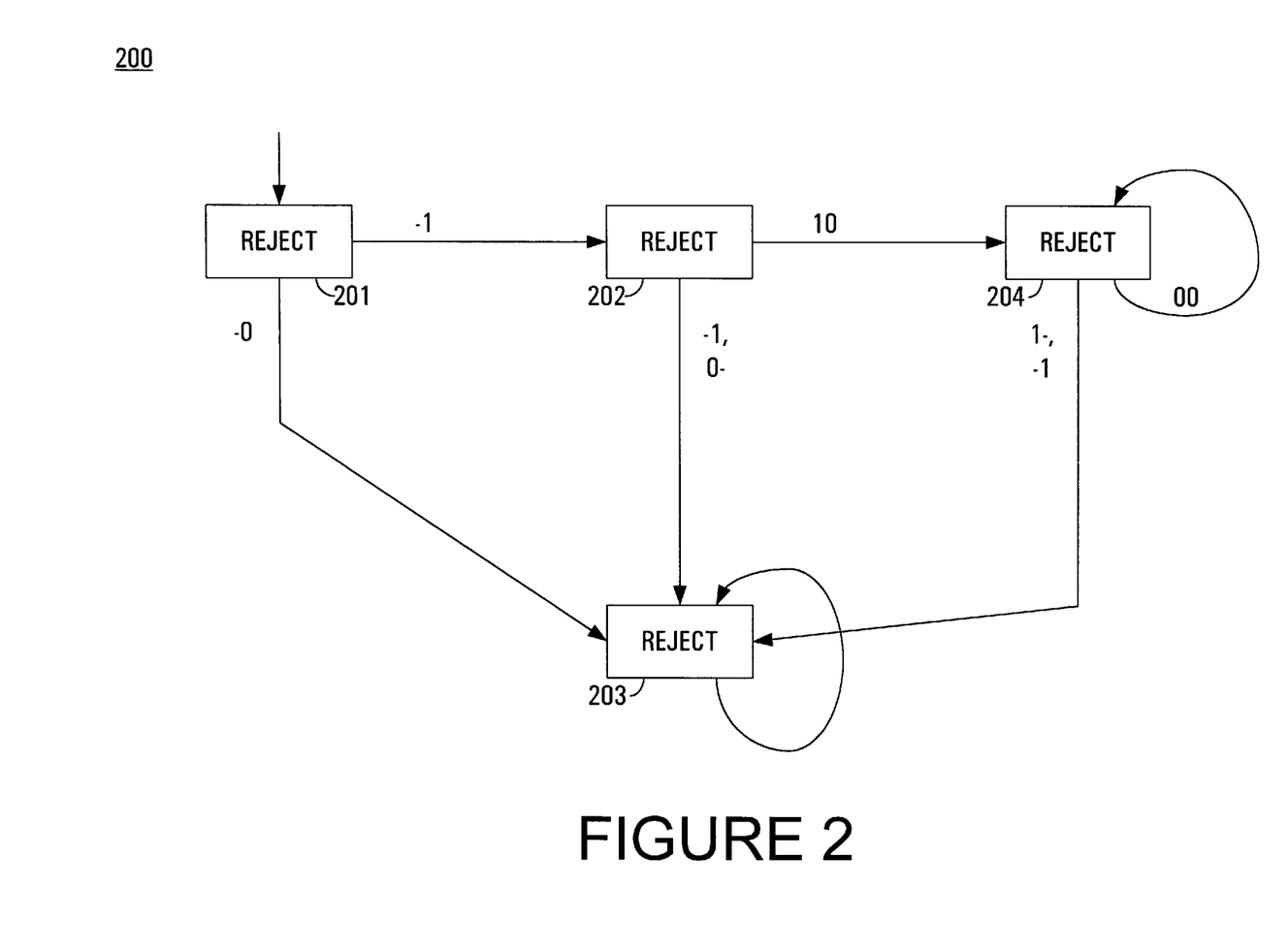
FIG. 2 shows a diagram of an automaton in accordance with one embodiment of the present invention.

Referring now to FIG. 2, a finite automaton 200 is shown. To see how automata can represent Presburger formulas, first consider regular languages consisting of strings over the alphabet of bit vectors $B^k$. These are the languages recognized by finite automata that read bit vectors. Automaton 200 is an example of such a machine (e.g., for k=2). Automaton 200 includes four states: reject state 201, reject state 202, reject state 203, and accept state 204. Automaton 200 recognizes the language.

$$\begin{pmatrix}0\\1\end{pmatrix}+\begin{pmatrix}1\\1\end{pmatrix}\begin{pmatrix}1\\0\end{pmatrix}\begin{pmatrix}0\\0\end{pmatrix}^*$$

Given automata representing languages f and g, there are well known algorithms to build new automata to represent the sets f, f+g, and f ^g. Particular components of the bit vectors can also be existentially quantified, forming an automaton with an alphabet of smaller dimension. For example, existentially quantifying the first component of the above language yields a new language in only one dimension, the language 100*. These operations are the basic building blocks of implicit state enumeration. Additionally, it should be noted that the minimum state automaton for a language is unique, and hence is a canonical form.

Each transition of an automaton must specify for which inputs the automaton is to follow that transition. When the letters of the alphabet are bit vectors with large dimension, the transition labels can get very complex. In accordance with the present invention, BDDs with multiple terminals are used as a practical implementation technique to efficiently represent the transitions of an automaton. Specifically, each state of an automaton points to a BDD that determines the next state as a function of the incoming bit vector. Terminal nodes of the BDD are possible next states, and the BDDs for different states can share common subgraphs.

Figure 3:
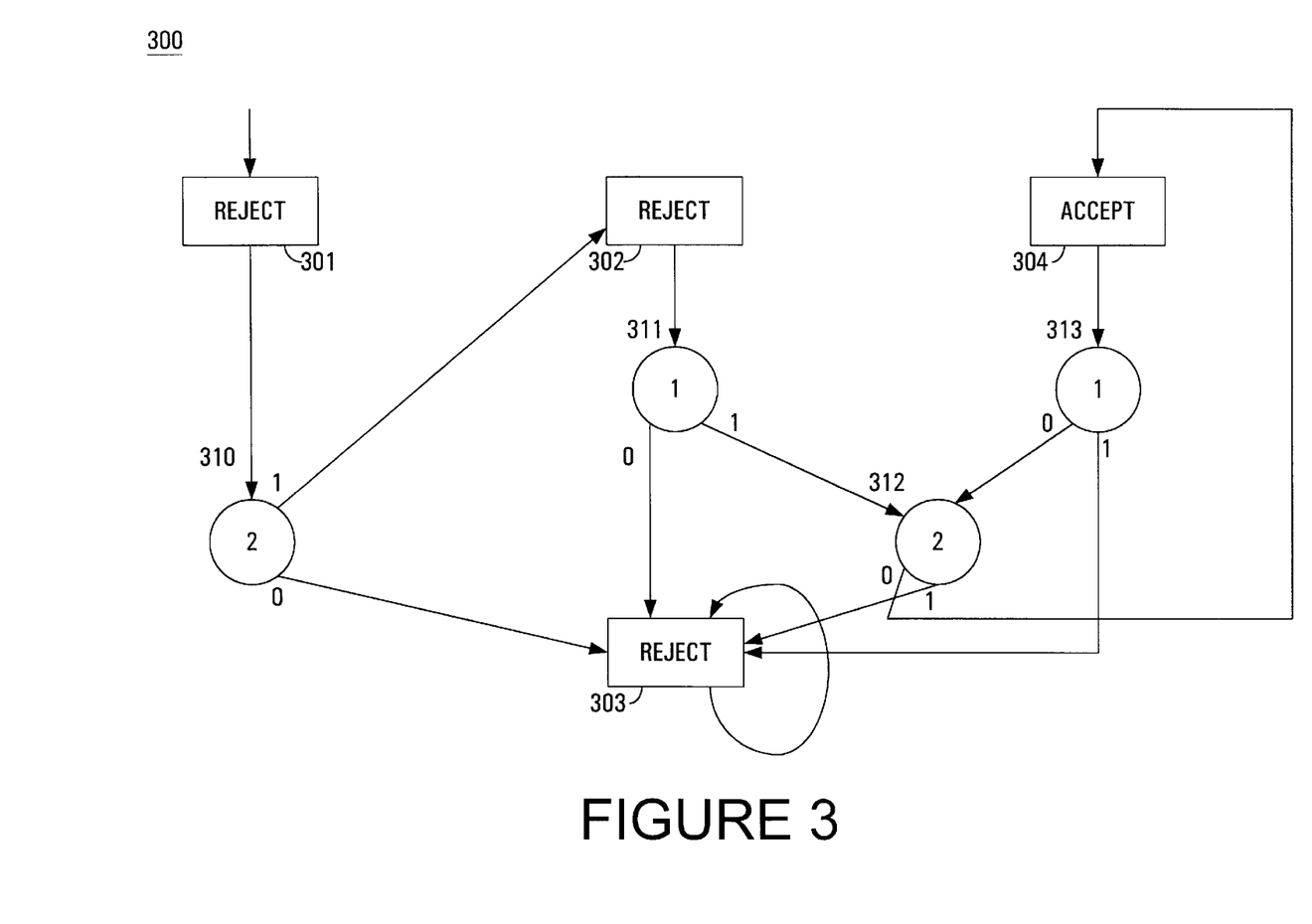
FIG. 3 shows a diagram of a more detailed automaton, equivalent to the automaton of FIG. 2, in accordance with one embodiment of the present invention.

With reference now to FIG. 3, an automaton 300 is shown. Automaton 300 includes reject states 301–303 and an accept state 304. It should be appreciated that automaton 300 of FIG. 3 is substantially the same as automaton 200 of FIG. 2. The transitions of automaton 300, however, are represented by binary decision symbols 310–313.

Given a bit string $b=b_0 b_1 \ldots b_{n-1} \in B^*$, it can be interpreted as a natural number with low order bits first:

$$x(b) = \sum_{i=0}^{n-1} b_i 2^i$$

This mapping is easily extended to multiple dimensions, $x:(B^k)^* \to N^k$. For example, the string of bit vectors:

string →

$x_1$: 0 0 1 0   bit
$x_2$: 1 1 1 0   vector
$x_3$: 1 1 0 1   ↓ represents the integer tuple $(x_1, x_2, x_3)=(4, 7, 11)$. It is known in the art that for a given Presburger formula an automaton can be constructed that represents the set of solutions of that formula. The constructed automaton accepts just those integer tuples that satisfy the formula. The automaton reads integer tuples using the above encoding.

Figure 4:
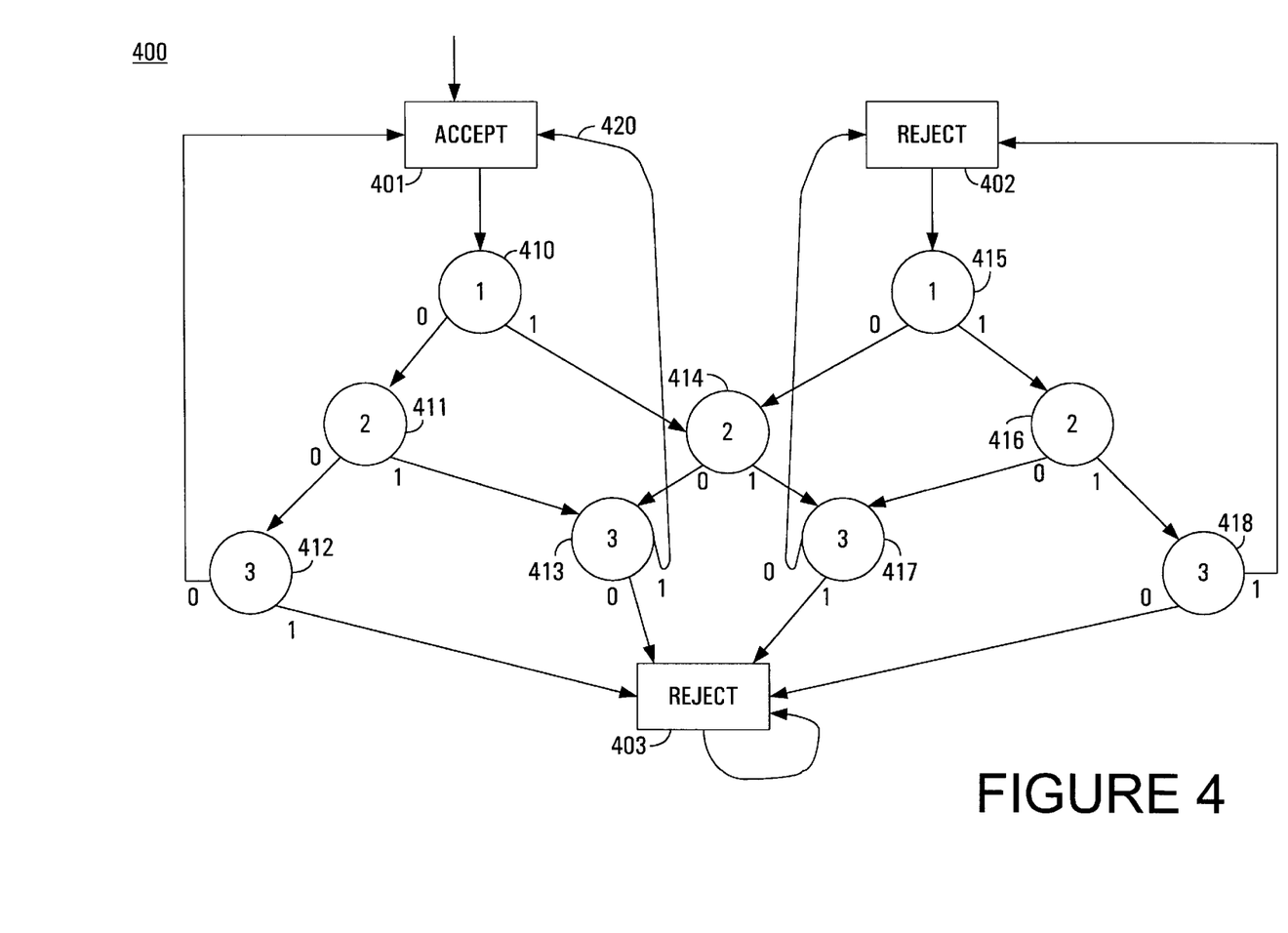
FIG. 4 shows a diagram of an automaton representing the relation X1+X2=X3.

FIG. 4 shows an automaton 400 that recognizes the integer tuples satisfying the Presburger formula $x_1+x_2=x_3$. Automaton 400 includes an accept state 401, a reject state 402, and a reject state 403. Automaton 400 also includes binary decision symbols 410–418. To illustrate the operation of automaton 400, consider again the integer tuple (4, 7, 11), represented by the string of bit vectors shown above. When reading this string, automaton 400 starts at the initial state, accept state 401. The first input has 0 for $x_1$, 1 for $x_2$, and 1 for $X_3$, which leads the automaton back to the initial state (e.g., via transition line 420), ready to read the second bit vector in the string. After reading all the bit vectors, the automaton will end in the accepting state, reflecting the fact that 4+7=11.

The above explanation uses a base 2 encoding. Instead, a base k encoding, for any k>2, could be used; the effect would be that a slightly different set of EFSMs would be representable.

Implicit State Enumeration

Given an EFSM, the objective is to calculate the set of reachable states $R \subseteq N^{ks}$. To accomplish this, the following iterative approach is used:

$R_o(x_s)=I(x_s)$ $R_{j+1}(x'_s)=R_j(x'_s)+\exists x_s, x_i, x_o(R_j(x_s)\hat{} T(x_i, x_s, x'_s, x_o))$ Here, the "+" symbol denotes logical disjunction. The sequence of $R_j$ is monotonically increasing but may not converge (since an infinite state system is being analyzed). However, all states $x_s$ for which any $R_j(x_s)$ is true are indeed reachable, so if any of these were not intended to be reachable, then a true design error has been exposed.

A key factor in the approach of the present invention is the observation that, if I and T are Presburger formulas, then the various $R_j$ are also Presburger formulas. When the data-path of an EFSM is composed of extended Presburger definable operations (e.g. addition and comparison) acting on natural numbers, T can indeed be expressed as Presburger formulas. The present invention uses automata to represent Presburger formulas, so the iterative calculation of reachable states is performed by union, intersection, and existential quantification of automata. An efficient minimization procedure generates canonical forms of the resulting automata. This keeps the representation as small as possible and allows testing for convergence to a fixed point.

The real systems which are to be verified have finite fixed width data-paths. The states of these systems can simply be mapped to strings of a finite fixed length. Once an automaton R is determined representing the set of reachable states for the unbounded EFSM, the present invention checks whether R accepts the string that represents the real state to decide if a given real state is reachable.

In order for this computation to be accurate, the transition relation T must accurately model the real system. The most common difficulty in building an accurate model is arithmetic overflow. Addition in an 8-bit system could be modeled in an EFSM by the formula:

$$(x+y<256\hat{}z=x+y)+(x+y\geq 256\hat{}z=x+y-256)$$

The effect of this, however, is to limit the computation on the EFSM to systems of a single width, which in fact unrolls the automata and results in computations isomorphic to BDDs.

In systems where overflow can occur, a new parameter variable can be introduced to specify the bound:

$$(x+y<b\hat{}z=x+y)+(x+y\geq b\hat{}z=x+y-b)$$

With this form of the transition relation, one is again representing an infinite class of systems and the compact looping structure of the automata is preserved. When checking for the reachability of a state of a real fixed width system, one represents the state by a string that includes the actual value of the bound.

Experimental Results of One Implementation

The discussions below disclose experimental results of one implementation of the present invention. The experimental results are discussed to show the results of a comparison of the conventional BDD-based approach to state reachability of systems with fixed width data-paths to the approach of the present invention, an automata-based approach to state reachability for the corresponding systems with unbounded width data-paths. To accomplish the following experiments, a package written in C was developed to manipulate automata with BDD transitions. This package was incorporated into the well-known "VIS" program, along with a front-end package that interprets a dialect of Verilog that includes wires carrying unbounded integer values and arithmetic modules that operate on them. The standard VIS program is used to characterize the BDD approach to state reachability for fixed width data-paths. The variable ordering in VIS was fixed to correspond to that used in the automata approach, by interleaving the data-path variables and putting the low order bits first; the control variables always precede the data variables. Each of the following experiments were run on a Sun Ultrasparc 3000 with a 168 MHz clock and 512 MB of main memory.

Several small designs with data-paths were developed; these are typical circuits found in DSP, communication protocol, and computer applications. The experimental circuits are briefly characterized in Table 1 below; control variables refers to the number of binary variables, data variables to the number of integer variables, and sequential depth to the greatest lower bound on the path length from the initial state to any reachable state.

The design "movavg" reads in a stream of numbers and keeps the sum of the last eight numbers read. It keeps these numbers in data registers, and on each cycle overwrites with the current input the register to update next. In each cycle the accumulator is decremented by the oldest number and incremented by the new number.

The design "sdiv" is a serial divider. A numerator and denominator are read in, and then the denominator is repeatedly subtracted from the numerator. The sequential depth of this machine grows exponentially with the width of the data-path, and is unbounded for unbounded integers. The EFSM reachable state calculation thus does not reach a fixed point, nor does the BDD reachability calculation converge in a practical time even for moderate sized data-paths.

The design "bound" is the EFSM shown in FIG. 1. It reads the x, y coordinates of two points and a difference vector, and checks whether the two points are closer than that difference. The checks are performed one at a time. The control states are one-hot encoded.

The design "euclid" implements Euclid's greatest common divisor algorithm. Two numbers are read in and saved. These numbers are copied to two working registers. At each cycle the smaller number is subtracted from the larger number. This process halts when the two numbers are equal, at which point they will have the value of the GCD of the numbers initially read in. This machine has a sequential depth that grows exponentially with the width of the data-path.

TABLE 1

Characteristics of experimental circuits.

| example | control variables | data variables | sequential depth fixed width w | sequential depth unbounded width |
|---|---|---|---|---|
| movavg | 9 | 9 | 15 | 15 |
| sdiv | 0 | 4 | $2^w$ | ∞ |
| bound | 6 | 6 | 5 | 5 |
| euclid | 0 | 4 | $2^w$ | ∞ |

TABLE 2

Sizes of automata and BDDs for reached state sets.
The columns labeled "8", "16", "24" and "32" give the BDD sizes for example instances having datapath widths of 8,16,24,and 32, respectively.

| example | automata size | 8 | 16 | 24 | 32 | ratio for 32 bits |
|---|---|---|---|---|---|---|
| movavg | 560 | 3361 | 7249 | 11137 | 15025 | 26.8 |
| sdiv | 3407 | 2002 | 11911 | 22423 | 32935 | 9.7 |
| bound | 2380 | 7013 | 17045 | 27077 | 37109 | 15.6 |
| euclid | 19196 | 36408 | 172090 | 307914 | 443738 | 23.1 |

Table 2 shows the BDD size and automaton size for the reachable state set for a given step of reachability. For "movavg", data is given for step 8 (where the peak sizes are seen) and for "bound" step 5 (the fixed point and peak). For "sdiv", the size grow gradually, hence, step 19 is shown as a representative example. For "euclid" they grow quickly, hence, step 6 is shown. For most examples, the BDD representation of the reached state set for 8-bit data-paths is already larger than the automata representation, and continues to grow roughly linearly with the width of the data-path. At 32 bits the BDDs are roughly 10 times larger or more; the final column (e.g., right most) shows the ratio of BDD sizes (for the 32-bit case) to the automaton sizes.

The sizes of the transition relations for the different circuits are shown in Table 3 below. In these cases the automata-based representation in accordance with the present invention does not show as consistent an advantage over BDDs as was shown for reachable state sets. Still, it should be noted that the BDD transition relations for 32-bit data-paths are larger in every case than the automata-based transition relation for unbounded width data-paths.

For a fixed w-width data-path, the BDD representing a state set or transition relation is never more than w larger than the corresponding automaton. This is not coincidental, since "unrolling" an automaton w times yields an acyclic automaton, essentially a BDD, representing the language of the original automaton restricted to length w strings. This fact strictly bounds the improvement that automata can achieve relative to BDDs.

TABLE 3

Sizes of automata and BDDs for monolithic transition relation.
The columns labeled "8", "16", "24" and "32" give the BDD sizes for example instances having datapath widths of 8,16,24,and 32, respectively.

| example | automata size | 8 | 16 | 24 | 32 |
|---------|---------------|------|-------|-------|-------|
| movavg  | 68320         | 16642| 34714 | 52786 | 70858 |
| sdiv    | 180           | 1036 | 2252  | 3468  | 4684  |
| bound   | 26096         | 3740 | 8236  | 12732 | 37109 |
| euclid  | 290           | 1804 | 3980  | 6156  | 8332  |

Summary of Invention

Figure 5:
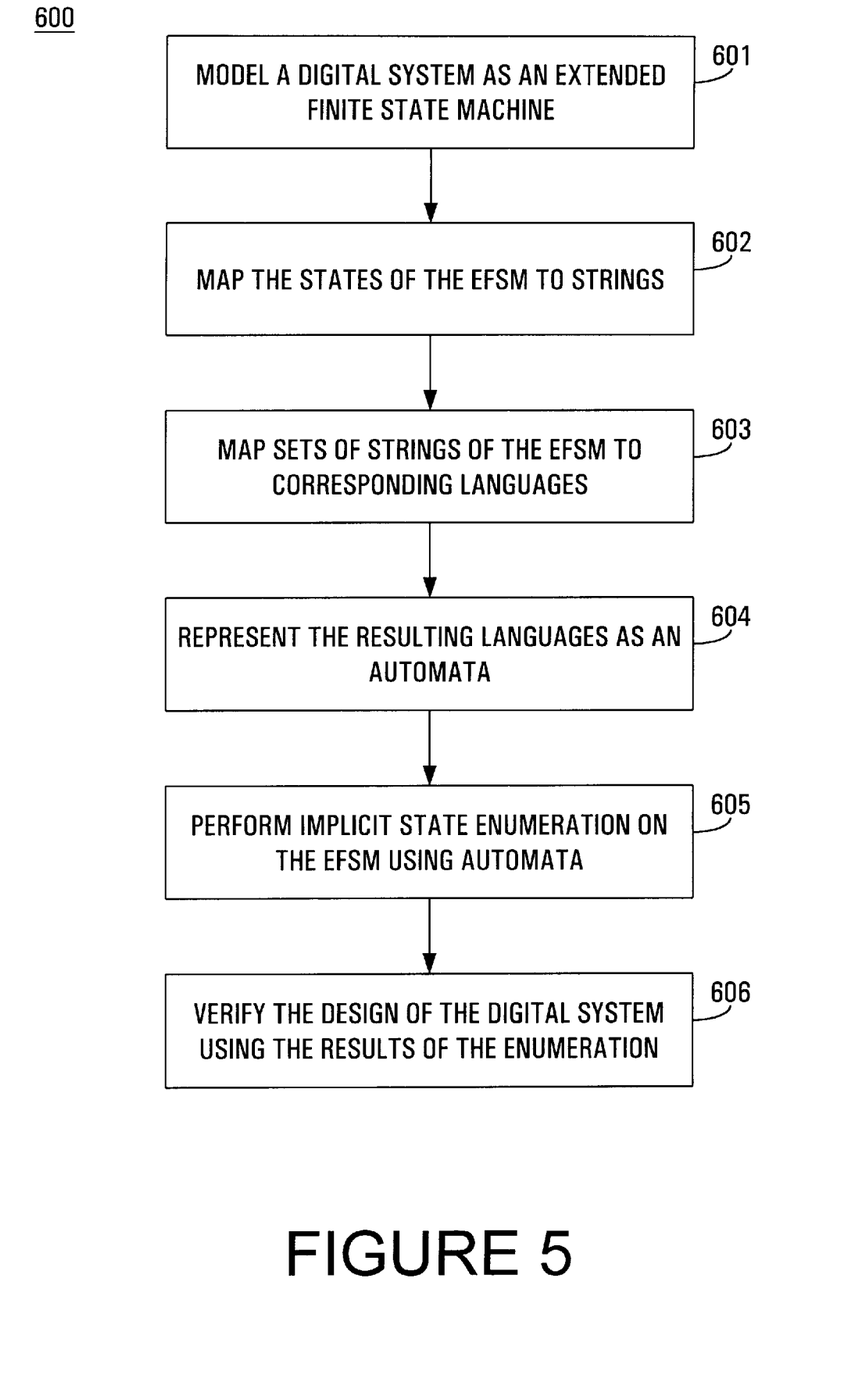
FIG. 5 is a flow chart of the steps of a process in accordance with one embodiment of the present invention.

Referring now to FIG. 5, a flow chart of the steps of a process 600 in accordance with one embodiment of the present invention is shown. Process 600 embodies the steps of the operating process of the present invention.

Process 600 begins in step 601, where a digital system is modeled as an extended finite state machine (EFSM). As described above, a digital system, for example, a microprocessor, can be modeled as an EFSM where the states of the EFSM correspond to the various states of the digital system.

In step 602, the states of the EFSM are mapped to strings. As described above, a string refers to a sequence of characters, wherein the characters are from a given alphabet. For the purposes of the digital system having a given number of variables (e.g., 10 variables) the alphabet has size 2 raised to the number of variables (e.g., $2^{10}$).

In step 603, the sets of strings of the ESFM are mapped to corresponding languages. As described above, the sets of strings collectively form a language.

In step 604, the resulting language is represented as an automaton. As described above, regular languages can be represented by finite state automata. Hence, the present invention represents the sets of strings from step 603 as automata.

In step 605, implicit state enumeration is performed on the EFSM. The automata from step 604 is used as a tool which facilitates the very efficient state enumeration process of the present invention. As described above, the automata is a data structure used to represent the sets of states of the EFSM and its transitions. This data structure is typically maintained in a memory of a computer system (e.g., computer system 712 from FIG. 6). By analyzing and processing the automata, implicit state enumeration is performed on the EFSM. The result of the enumeration is a set of reachable states from a given initial state.

In step 606, the design of the digital system is verified using the results of the enumeration. The results of the enumeration yield the set of reachable states for the EFSM, and thus, for the digital system. Thus, once the set of reachable states is determined, the designer or engineer of the digital system determines whether any undesired states exist within the set of reachable states. An undesired state, for example, would include a state which leads to a malfunction or error condition. In so doing, the design of the digital system can be verified.

The Computer System Environment of the Present Invention

Figure 6:
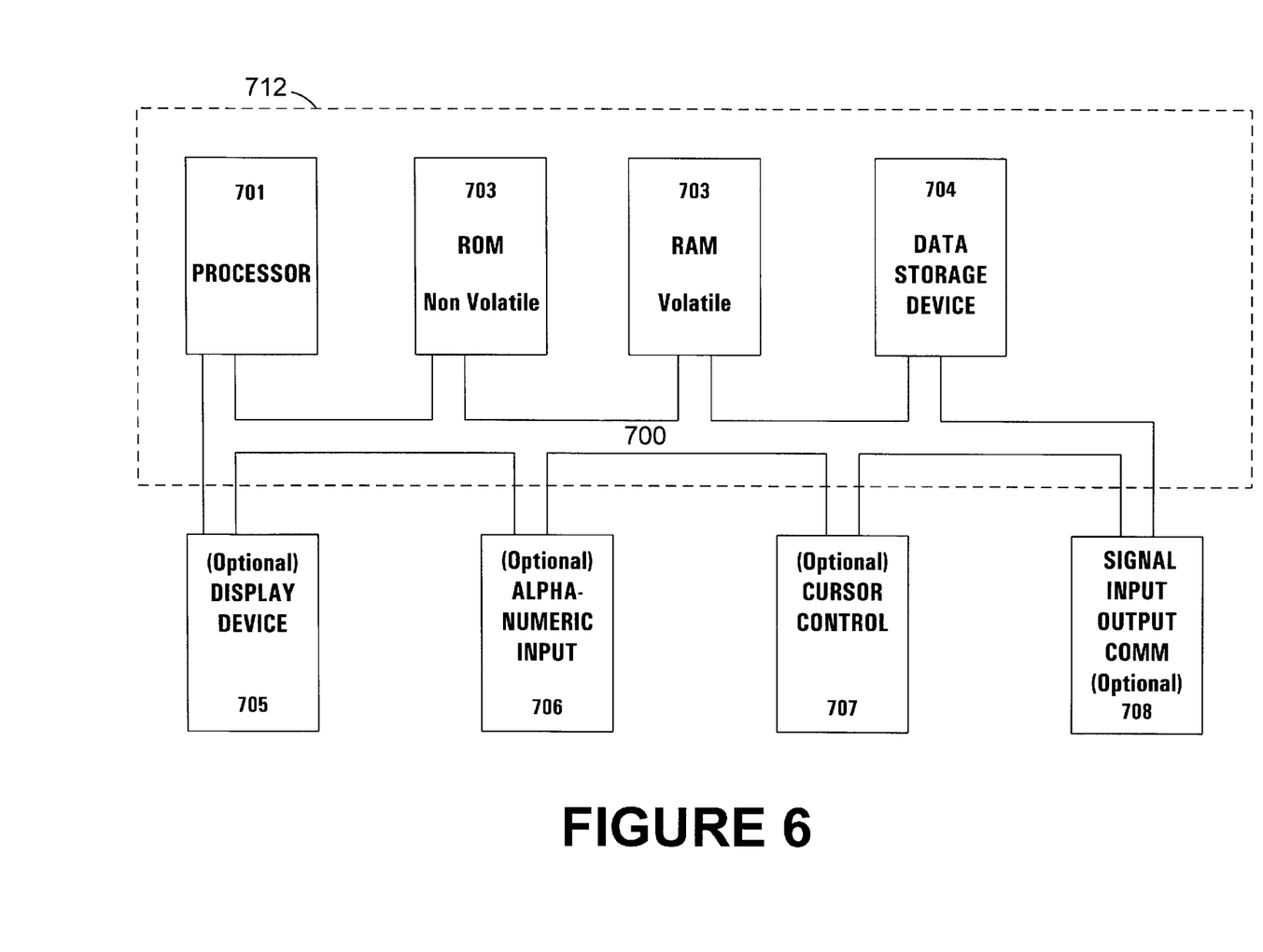
FIG. 6 shows a diagram of a computer system suited for use with the present invention.

Refer to FIG. 6 which illustrates a computer system 712. Within the following discussions of the present invention, certain processes and steps are discussed (e.g., process 900 of FIG. 6) that are realized, in one embodiment, as a series of instructions (e.g., software program) that reside within computer readable memory units of system 712 and executed by processors of system 712. When executed, the instructions cause the computer system 712 to perform specific actions and exhibit specific behavior which is described in detail above.

In general, computer system 712 used by the present invention comprises an address/data bus 700 for communicating information, one or more central processors 701 coupled with the bus 700 for processing information and instructions, a computer readable volatile memory unit 702 (e.g., random access memory, static RAM, dynamic, RAM, etc.) coupled with the bus 700 for storing information and instructions for the central processor(s) 701, a computer readable non-volatile memory unit (e.g., read only memory, programmable ROM, flash memory, EPROM, EEPROM, etc.) coupled with the bus 700 for storing static information and instructions for the processor(s) 701. System 712 also includes a mass storage computer readable data storage device 704 such as a magnetic or optical disk and disk drive coupled with the bus 700 for storing information and instructions. Optionally, system 712 can include a display device 705 coupled to the bus 700 for displaying information to the computer user, an alphanumeric input device 706 including alphanumeric and function keys coupled to the bus 700 for communicating information and command selections to the central processor(s) 701, a cursor control device 707 coupled to the bus for communicating user input information and command selections to the central processor(s) 701, and a signal generating device 708 coupled to the bus 700 for communicating command selections to the processor (s) 701.

Conclusion

Thus, in accordance with the present invention, BDD-based implicit state enumeration of FSMs can be generalized to automata -based implicit state enumeration of infinite state EFSMs. The above experiments demonstrate that an automaton representation of an unbounded width datapath in accordance with the present invention can be 10× more compact than the BDD representation of the corresponding 32-bit datapath. Using this same automata-based approach of the present invention, experimental results were also presented for the "Dining Philosophers" iterated system that show that safety properties can be verified for an arbitrary n-philosopher system more efficiently than for a BDD-based approach for a fixed n greater than or equal to 12. These results point the way to a new approach for handling the "state explosion" problem (i.e., the greatly increasing number of possible states) caused by wide datapaths and large iterated systems.

Consequently, the present invention provides a more efficient method and system for state reachability analysis for complex systems having a very large number of possible states. The process of the present invention provides an efficient method and system for functional verification of the design of a complex system having a very large number of possible states. In addition, the system of the present invention can efficiently process and analyze a state machine model having an extremely large (or even infinite) number of possible states.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In a computer system having a processor, and a memory coupled to the processor via a bus, the memory containing computer readable instructions which when executed by the processor cause the processor to implement a method of verifying a design of a digital system, the method comprising a computer system performing the steps of:

modeling a digital system as an extended finite state machine;

mapping a plurality of states of the extended finite state machine to a corresponding plurality of strings;

mapping sets of the plurality of strings into a corresponding language;

representing the corresponding language as an automaton;

applying automata operations to the automata to efficiently compute the set of reachable states of the extended finite state machine from an initial state; and determining whether the set of reachable states includes an undesirable state in order to verify a design of the system.

2. The method of claim 1, further including the step of performing implicit state enumeration on the extended finite state machine using the automata to efficiently compute the set of reachable states.

3. The method of claim 1, further including the step of determining whether the set of reachable states includes an undesirable state wherein the undesirable state corresponds to an error condition in the system.

4. In a computer system having a processor, and a memory coupled to the processor via a bus, a computer implemented method of verifying a digital system design comprising a computer system performing the steps of:

modeling a digital system as an extended finite state machine;

mapping a plurality of states of the extended finite state machine to a corresponding plurality of strings;

mapping sets of the plurality of strings into a corresponding language;

representing the corresponding language as an automaton, wherein a set of finite words are used to represent a transition relation of the extended finite state machine and wherein arithmetic operations of the extended finite state machine are generalized to unbounded integers;

applying automata operations to the automata to efficiently compute the set of reachable states of the extended finite state machine from an initial state; and verifying the design of the system by determining whether the set of reachable states includes an undesirable state.

5. The method of claim 4, further including the step of performing implicit state enumeration on the extended finite state machine using the automata to efficiently compute the set of reachable states.

6. The method of claim 4, further including the step of determining whether the set of reachable states includes an undesirable state wherein the undesirable state corresponds to an error condition in the system.

7. The method of claim 4, further including the step of verifying a design for a plurality of widths of a datapath of the system using an extended finite state machine.

8. The method of claim 4, further including the step of representing the transitions of the automata as a plurality of binary decision diagrams.

9. In a computer system having a processor, and a memory coupled to the processor via a bus, a computer readable medium containing computer readable instructions, the instructions which when executed by the processor cause the processor to implement a method, the method comprising a computer system performing the steps of:

modeling a digital system as an extended finite state machine;

mapping a plurality of states of the extended finite state machine to a corresponding plurality of strings;

mapping sets of the plurality of strings into a corresponding language;

representing the corresponding language as an automaton, wherein finite words are used to represent a transition relation of the extended finite state machine and wherein arithmetic operations of the extended finite state machine are generalized to unbounded integers;

applying automata operations to the automata to efficiently compute the set of reachable states of the extended finite state machine from an initial state;

verifying the design of the system by determining whether the set of reachable states includes an undesirable state.

10. The method of claim 9, further including the step of performing implicit state enumeration on the extended finite state machine using the automata to efficiently compute the set of reachable states.

11. The method of claim 9, further including the step of determining whether the set of reachable states includes an undesirable state wherein the undesirable state corresponds to an error condition in the system.

12. The method of claim 9, further including the step of verifying a design the system for a plurality of widths of a datapath of the system using an extended finite state machine.

13. The method of claim 9, further including the step of representing the transitions of the automata as a plurality of binary decision diagrams.

* * * * *